US009023681B2

(12) United States Patent
Niu et al.

(10) Patent No.: US 9,023,681 B2
(45) Date of Patent: May 5, 2015

(54) METHOD OF FABRICATING HETEROJUNCTION BATTERY

(71) Applicant: Chint Solar (Zhejiang) Co.,Ltd., Hangzhou (CN)

(72) Inventors: Xinwei Niu, Hangzhou (CN); Cao Yu, Hangzhou (CN); Lan Ding, Hangzhou (CN); Junmei Rong, Hangzhou (CN); Shiyong Liu, Hangzhou (CN); Minghua Wang, Hangzhou (CN); Jinyan Hu, Hangzhou (CN); Weizhi Han, Hangzhou (CN); Yongmin Zhu, Hangzhou (CN); Hua Zhang, Hangzhou (CN); Tao Feng, Hangzhou (CN); Jianbo Jin, Hangzhou (CN); Zhanwei Qiu, Hangzhou (CN); Liyou Yang, Hangzhou (CN)

(73) Assignee: Chint Solar (Zhejiang) Co., Ltd., Hangzhou (CN)

( * ) Notice: Subject to any disclaimer, the term of this patent is extended or adjusted under 35 U.S.C. 154(b) by 0 days.

(21) Appl. No.: 14/036,542

(22) Filed: Sep. 25, 2013

(65) Prior Publication Data
US 2014/0308773 A1  Oct. 16, 2014

(30) Foreign Application Priority Data
Apr. 11, 2013 (CN) .......................... 2013 1 0125902

(51) Int. Cl.
*H01L 21/00* (2006.01)
*H01L 31/20* (2006.01)

(52) U.S. Cl.
CPC ..................................... *H01L 31/20* (2013.01)

(58) Field of Classification Search
USPC ........ 438/20, 56, 57, 61, 72, 94; 257/79, 432, 257/E31.127, E31.043, E31.124
See application file for complete search history.

(56) References Cited

U.S. PATENT DOCUMENTS

2013/0210185 A1* 8/2013 Yoshimi et al. ................. 438/57

* cited by examiner

*Primary Examiner* — Mark A Laurenzi
(74) *Attorney, Agent, or Firm* — Ladas & Parry LLP (57) ABSTRACT

The present invention discloses a method of fabricating a heterojunction battery, comprising the steps of: depositing a first amorphous silicon intrinsic layer on the front of an n-type silicon wafer, wherein the n-type silicon wafer may be a monocrystal or polycrystal silicon wafer; depositing an amorphous silicon p layer on the first amorphous silicon intrinsic layer; depositing a first boron doped zinc oxide thin film on the amorphous silicon p layer; forming a back electrode and an Al-back surface field on the back of the n-type silicon wafer; and forming a positive electrode on the front of the silicon wafer. In addition, the present invention further discloses a method of fabricating a double-sided heterojunction battery. In the present invention, the boron doped zinc oxide is used as an anti-reflection film in place of an ITO thin film; due to the special nature, especially the light trapping effect of the boron doped zinc oxide, the boron doped zinc oxide can achieve good anti-reflection. Therefore, the step of texturization is removed and the fabrication process simplified. As polycrystal silicon texturization is more challenging, the present invention is of more significance to heterojunction batteries using a polycrystal silicon wafer.

13 Claims, 8 Drawing Sheets

METHOD OF FABRICATING HETEROJUNCTION BATTERY

BACKGROUND

The present invention relates to the technical field of solar batteries, and more specifically, to a method of fabricating a heterojunction battery.

The application of solar batteries has achieved remarkable progress in recent years. Crystalline silicon solar batteries, with advantages such as high photoelectric conversion efficiency and mature production techniques, have dominated the world's total solar battery output. Although the production process of crystal silicon solar batteries is advancing constantly, the lack of a good surface passivation mechanism and a range of emitter problems caused by the high temperature diffusion pn junction process in traditional production of crystal silicon solar batteries have not yet been improved, thereby limiting the enhancement of battery efficiency.

In the meanwhile, the industry always endeavors to explore a thin film solar battery manufacturing technique with low cost, high output and high efficiency. As the production process of hydrogenated amorphous silicon (α-Si:H) solar battery requires a low temperature (under 400°), without using silicon wafers and hence is convenient for large scale production, so it is highly valued and has been developed quickly. However, the photo-degradation of hydrogenated amorphous silicon solar batteries has not been well solved, and the photoelectric conversion efficiency is yet to be further improved.

Researchers have been devoted to combining advantages of crystal silicon batteries and thin film batteries to form higher-efficiency batteries. One approach is to use a wideband gap hydrogenated amorphous silicon layer as a window layer or emitter and use a narrowband gap monocrystal silicon or polycrystal silicon wafer as a substrate for forming the so-called heterojunction solar batteries. While taking advantages of the thin film production process, such batteries give full scope of performance and characteristics of crystal silicon and amorphous silicon materials and have development prospects of achieving high-efficiency while low-cost silicon solar batteries. It was reported in 1983 that Hamakawa et al. first adopted a-Si:H(p)/c-Si(n) heterostructured laminated solar batteries and achieved a photoelectric conversion efficiency of 12%. In 1991 Sanyo fabricated a-Si:H(p)/a-Si:H(i)/c-Si(n)-structured solar batteries with a conversion efficiency of more than 16% by using PECVD, and they referred to the structure of inserting between p-type a-Si:H and n-type x-Si a thin-layer intrinsic a-Si:H as a buffer layer as "HIT (Heterojunction with Intrinsic Thin-Layer) structure." In 1994, their research made significant progress, i.e. fabricated on an area of 1 cm$^2$ a HIT structured solar battery with a photoelectric conversion efficiency of 20.1%. Based thereon, Sanyo soon launched industralization research on HIT™ solar batteries and achieved industrial large scale production of HIT™ solar batteries. A HIT™ solar battery being produced with an area of more than 100 cm$^2$ still has a photoelectric conversion efficiency of 17.3%, and output power of 96 pieces of battery component is 180 W, the battery components being named "HIT Power 21." In 2003, Sanyo rewrote the highest record of conversion efficiency of HIT™ solar batteries with an area of 100 cm$^2$ as 21.2%, and the industrial large scale production also hits a 18.5% photoelectric conversion efficiency.

Figure 1:
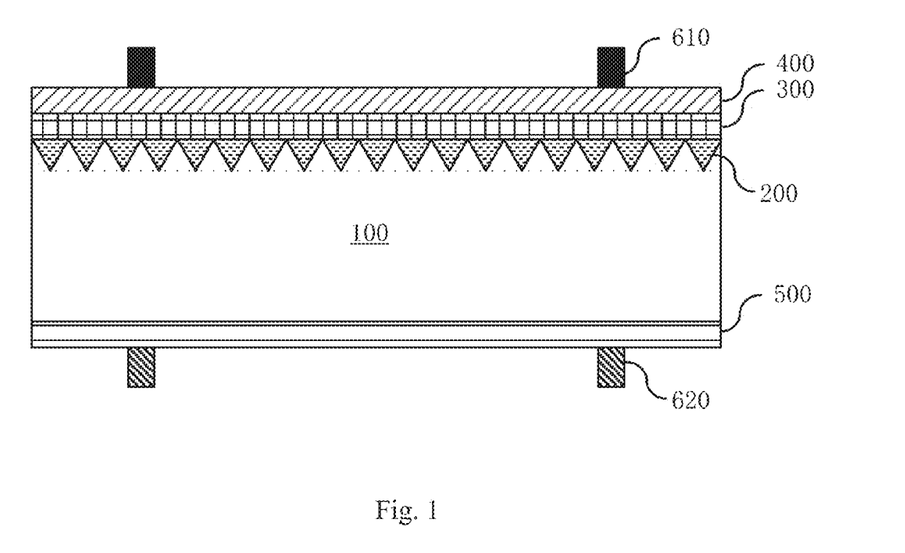
FIG. 1 is a structure of a traditional silicon-amorphous silicon heterojunction battery.
Figure 2:
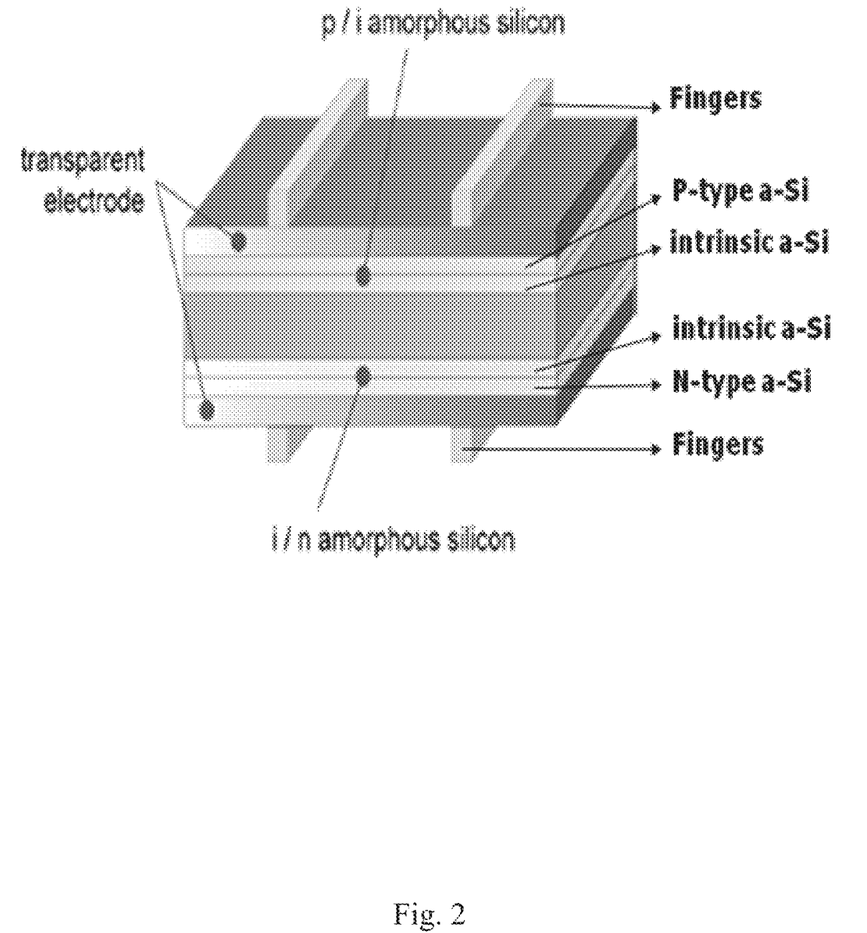
FIG. 2 is a schematic view of a HIT battery having double-sided structure.

With reference to FIGS. 1 and 2, the known basic fabricating procedure of a heterojunction battery is as follows: 1) first using a process similar to a crystal silicon battery to fabricate a textured structure at a surface of a wafer, so as to obtain light trapping effect; 2) using PECVD to deposit a 5 nm-10 nm-thick intrinsic a-Si:H and p-type a-Si:H layer on the front of an n-type CZ-Si wafer (180-250 um-thick) with a textured structure; 3) depositing a 20 nm-thick intrinsic a-Si:H and n-type a-Si:H layer on the back of the c-Si wafer; 4) using a sputter technique to deposit a TCO transparent conducting film on two sides of a battery, the conducting film also having ante-reflection effect; 5) plating a metallic aluminum on the back of the battery; 6) then making Ag electrode on the front of the battery by using a silkscreen printing technique. The entire fabricating procedure is implemented under 200□. The HIT battery having double-sided structure needs to plate an ITO transparent electrode on its back in step (4) and then make Ag electrode on both the front and back in step (6). Since the double-sided battery can receive reflected light from the ground, it can produce more electricity energy than a single-sided battery no matter whether the ground is smooth or not.

As is clear from the foregoing basic process, the traditional heterojunction battery further needs to fabricate a textured structure at a surface of a silicon wafer so as to obtain light trapping effect, such practice being basically the same as that of a crystal silicon battery. The process is very hard to control, which not only consumes a large amount of valuable chemicals but also consumes precious silicon wafer materials due to the corrosion reaction; in the meanwhile, since textures formed at the surface are quite uneven, and the uneven surface can hardly be completely covered by a thin intrinsic and p-type amorphous silicon film (a total thickness between 10 nm and 30 nm) during the procedure for forming heterojunction, which disadvantageously and seriously hinders the boost of open-circuit voltage. On the other hand, the traditional heterojunction battery uses sputtered ITO as a conductive oxide (TCO) material, whereas ITO materials are very expensive, which becomes the bottleneck of large scale production and utilization of solar battery. Heterojunction batteries, though having a high efficiency, is refrained from promotion by complex structure and process steps coupled with expensive materials. Therefore, there is current a need for a heterojunction battery fabricating method capable of reducing the production cost while enhancing the battery photoelectric conversion efficiency.

SUMMARY

Methods provided by the present invention greatly simplify the structure of traditional heterojunction batteries and reduce the manufacture cost while improving the quality of batteries. Among the methods provided by the present invention, a battery's electric conduction effect, light trapping effect and anti-reflection effect are integrated by using new materials, which are independent of a silicon wafer. Concrete technical solutions of the present invention are as below:

According to one aspect of the present invention, there is provided a method of fabricating a heterojunction battery, comprising the steps of:

a) depositing a first amorphous silicon intrinsic layer on the front of an n-type silicon wafer;

b) depositing an amorphous silicon p layer on the first amorphous silicon intrinsic layer;

c) depositing a first boron doped zinc oxide thin film on the amorphous silicon p layer;

d) forming a back electrode and an Al-back surface field on the back of the n-type silicon wafer;

e) forming a positive electrode on the front of the n-type silicon wafer.

According to another aspect of the present invention, there is provided a method of fabricating a double-sided heterojunction battery, comprising the steps of:

a) depositing a first amorphous silicon intrinsic layer on the front of an n-type silicon wafer;

b) depositing an amorphous silicon p layer on the first amorphous silicon intrinsic layer;

c) depositing a second amorphous silicon intrinsic layer on the back of the n-type silicon wafer;

d) depositing an amorphous silicon n layer on the second amorphous silicon intrinsic layer;

e) depositing a first boron doped zinc oxide thin film on the amorphous silicon p layer, and depositing a second boron doped zinc oxide thin film on the amorphous silicon n layer;

f) forming a back electrode on the back of the n-type silicon wafer;

g) forming a positive electrode on the front of the n-type silicon wafer.

Figure 7:
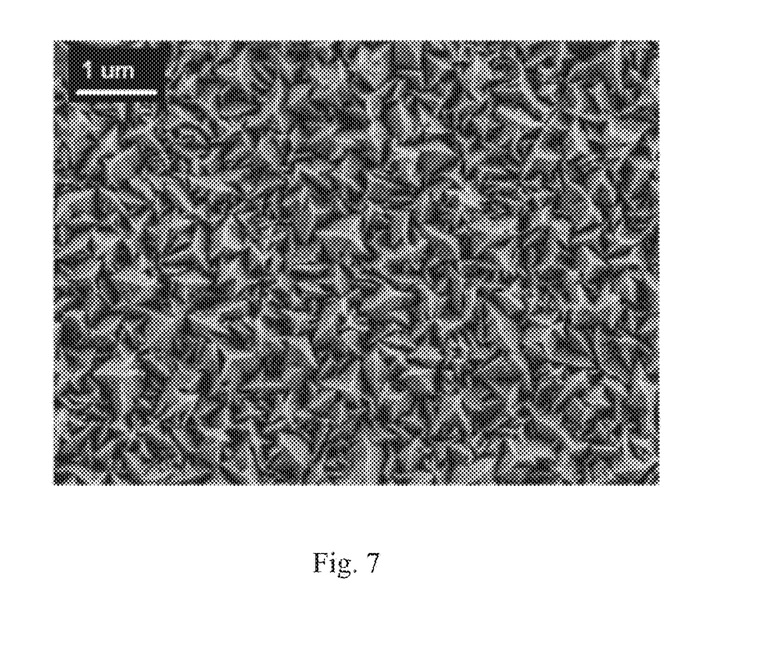
FIG. 7 is a micrograph of a LPCVD BZO surface structure.
Figure 8:
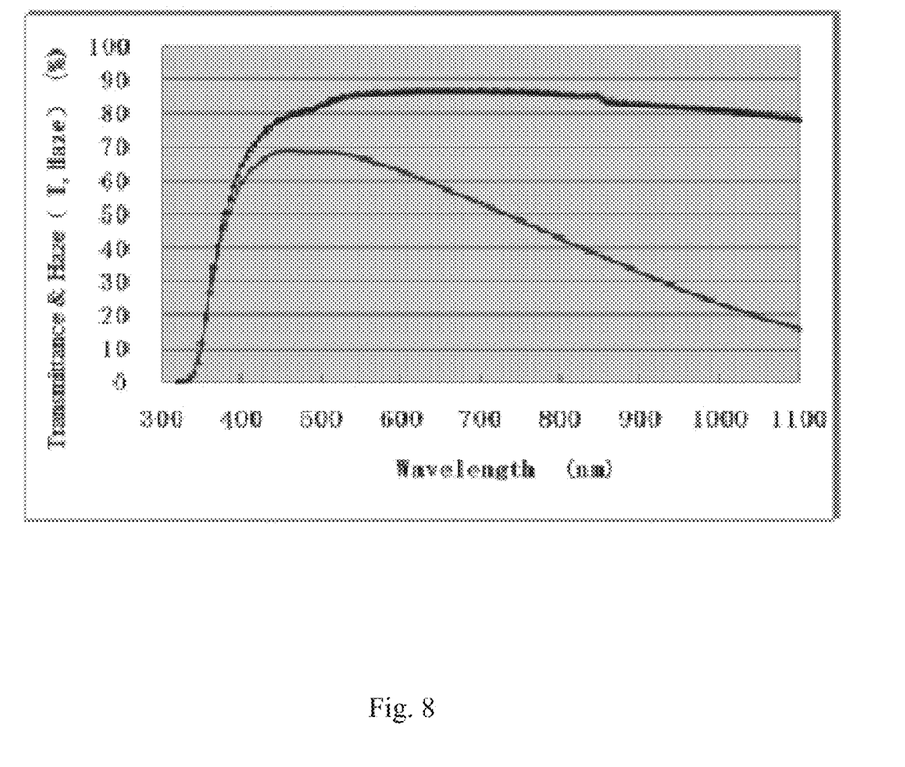
FIG. 8 is a curve diagram of optical properties of a LPCVD BZO.

In the present invention, an LPCVD-Boron doped Zinc Oxide (BZO) used in the field of silicon-based thin film batteries is used as a transparent conducting oxide (TCO) material to replace the common sputtered Indium Tin Oxide (ITO) material in traditional heterojunction batteries. With reference to FIGS. 7 and 8, since Low Pressure Chemical Vapor Deposition (LPCVD) method is adopted, the BZO thin film being formed has nature pyramid morphology, which may produce excellent light trapping effect on a surface of a silicon wafer. Thus, a method of forming light trapping effect by texturizing on a surface of a silicon wafer in the traditional process can be replaced. The complex texturization procedure is difficult to control in the battery production, and consumes a large amount of chemicals (acid or alkaline solutions); in particular, the texturization process for polycrystal silicon is more complex and becomes a difficulty in the crystal silicon battery production. In the present invention, texturization steps of etching a surface of silicon wafer are removed completely, the process steps are therefore simplified greatly and the manufacture cost is reduced.

Figure 9A:
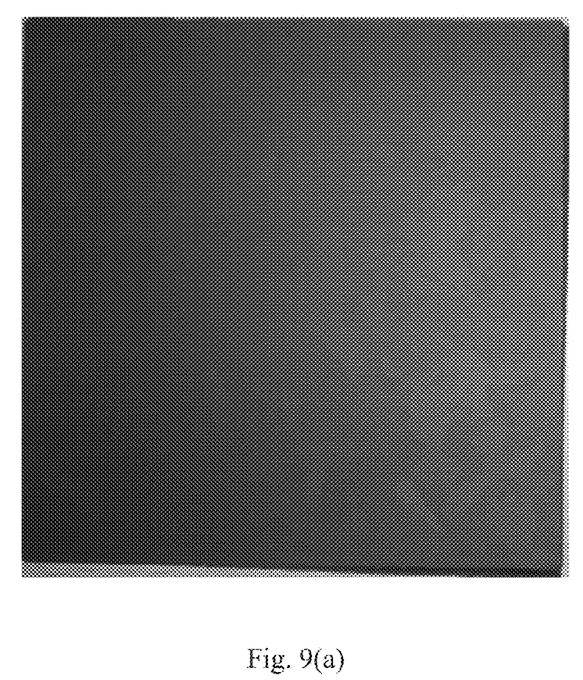
FIG. 9(a) is a photo of a surface of a silicon wafer where a BZO thin film is deposited.
Figure 9B:
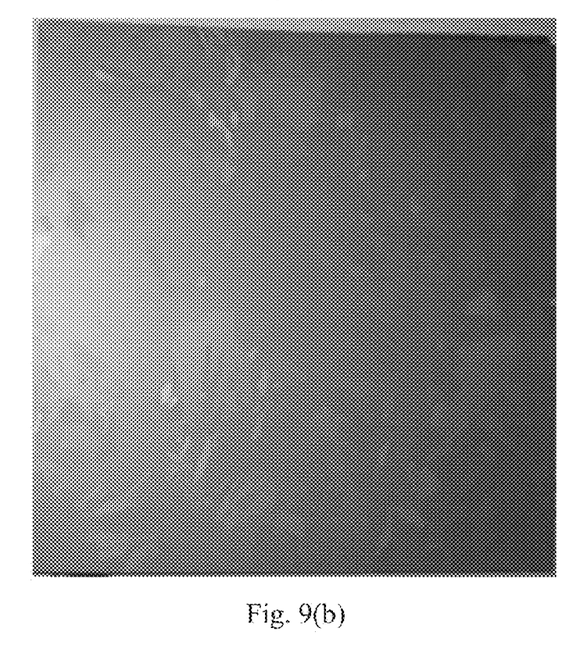
FIG. 9(b) is a photo of a surface of a silicon wafer that has been cleaned but not texturized yet.

In the traditional heterojunction battery, expensive ITO material is used as not only an anti-reflection film but also a front electrode to collect current together with printing grid lines (fingers). A main reason is that ITO has good light transmission, electroconductivity and proper optical refractive index. The LPCVD-Boron doped Zinc Oxide adopted in the present invention, in addition to fulfilling the light trapping effect, can completely replace these functions of the ITO film, thereby integrating the functionalities of light trapping, conduction and anti-reflection. As is clear from FIG. 9(a), after depositing the BZO thin film, the surface of the silicon wafer is blackened and has no obviously bright area, i.e. light trapping and anti-reflection are enhanced; as shown in FIG. 9(b), the cleaned surface of the silicon wafer with no texture has many bright areas, and following texturization is needed or the BZO thin film needs to be deposited, so as to enhance light trapping and anti-reflection effects.

In addition, to fabricate heterojunction on a rough silicon surface formed by alkaline or acid texturization is a quite challenging technique and has inherent drawbacks. Since the step of wet-texturizing a silicon surface is removed, heterojunction may be formed on a flat silicon surface, and the deposited amorphous silicon film achieves full coverage. In this manner, it greatly helps to boost the battery's open-circuit voltage and further increase the battery's photoelectric conversion efficiency.

BRIEF DESCRIPTION OF THE SEVERAL VIEWS OF THE DRAWINGS

Other features, objects and advantages of the present invention will become more apparent from the following detailed description of non-limiting embodiments, when taken in conjunction with the accompanying drawings, wherein the same or similar reference generally refers to the same or similar components.

DETAILED DESCRIPTION

The following disclosure provides many different embodiments or examples to implement different structures of the present invention. To simplify the disclosure of the present invention, description is presented below with respect to components and arrangements of specific examples. In addition, the numerals and/or letters may be repeatedly used in different examples of the present invention. Such repetition is for simplicity and clarity purposes and does not suggest relationships among the various embodiments and/or arrangements under discussion. It should be noted that components shown in the figures are not necessarily drawn proportionally. The present invention ignores descriptions of well-known components, treatment techniques and process so as to avoid unnecessarily limiting the present invention.

Figure 3:
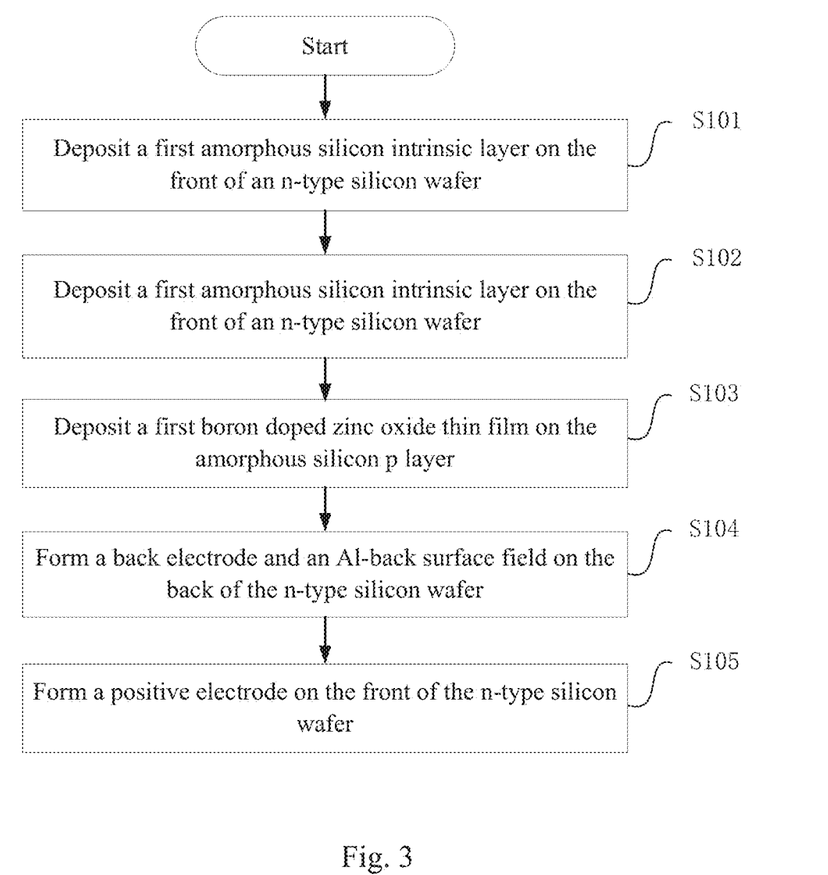
FIG. 3 is a schematic flowchart of a method of fabricating a heterojunction battery according to one specific embodiment of the present invention.
Figure 4:
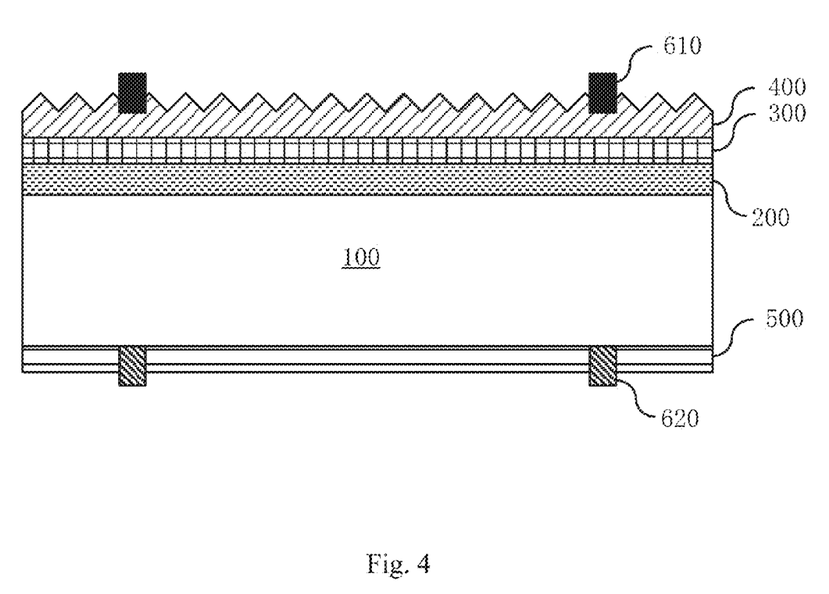
FIG. 4 is a schematic structural diagram of a method of fabricating a heterojunction battery according to further one specific embodiment of the present invention.

With reference to FIGS. 3 and 4, they are respectively a schematic flowchart of a method of fabricating a heterojunction battery in the present invention and the schematic structural diagram of the same.

In step S101, a first amorphous silicon intrinsic layer 200 is deposited on the front of an n-type silicon wafer 100, which n-type silicon wafer 100 here may be a monocrystal or polycrystal silicon wafer. Before depositing amorphous silicon intrinsic layer 200, a surface of n-type silicon wafer 100 needs to be cleaned and cut-damaged, so as to fabricate a high-efficiency heterojunction battery on the smooth silicon wafer (damage removed).

Optionally, PECVD (Plasma Enhanced Chemical Vapor Deposition) method is adopted to deposit the amorphous silicon material to form first amorphous silicon intrinsic layer 200. Preferably, the range of the thickness of first amorphous silicon intrinsic layer 200 is between 5 nm and 30 nm, e.g. 5 nm, 18 nm or 30 nm.

In step S102, an amorphous silicon p layer 300 is deposited on first amorphous silicon intrinsic layer 200. Optionally, PECVD method is used to deposit the amorphous silicon material to form amorphous silicon p layer 300. Preferably, the range of the thickness of amorphous silicon p layer 300 is between 5 nm and 30 nm, e.g. 5 nm, 18 nm or 30 nm.

In step S103, a first boron doped zinc oxide thin film (BZO) 400 is deposited on amorphous silicon p layer 300. Optionally, LPCVD (Low Pressure Chemical Vapor Deposition) method is adopted to deposit first boron doped zinc oxide thin film (BZO) 400 on amorphous silicon p layer 300. Preferably, the range of the thickness of first boron doped zinc oxide thin film (BZO) 400 is between 500 nm and 1000 nm, e.g. 500 nm, 750 nm or 1000 nm.

As is clear from FIG. 7, a surface of first boron doped zinc oxide thin film 400 presents a pyramid structure; this structure has good light trapping effect and thus can completely replace texturization and relevant cleaning process in the traditional process. In addition, forming an anti-reflection film by depositing first boron doped zinc oxide thin film 400 in place of sputtering ITO (Indium Tin Oxide) can greatly reduce the usage amount of expensive ITO and further save the production cost.

In step S104, a back electrode 620 and an Al-back surface field 500 are formed on the back of n-type silicon wafer 100. Al-back surface field 500 may be formed by printing an aluminum paste on the back of n-type silicon wafer 100 by silk-screen printing method and then sintering it.

In step S105, a positive electrode 610 is formed on the front of n-type silicon wafer 100. Optionally, such back electrode 620 and/or positive electrode 610 may be fabricated by printing silver paste or electrocoppering. Optionally, back electrode 620 and/or positive electrode 610 may be formed using electroplating or silk-screen printing, etc.

Figure 5:
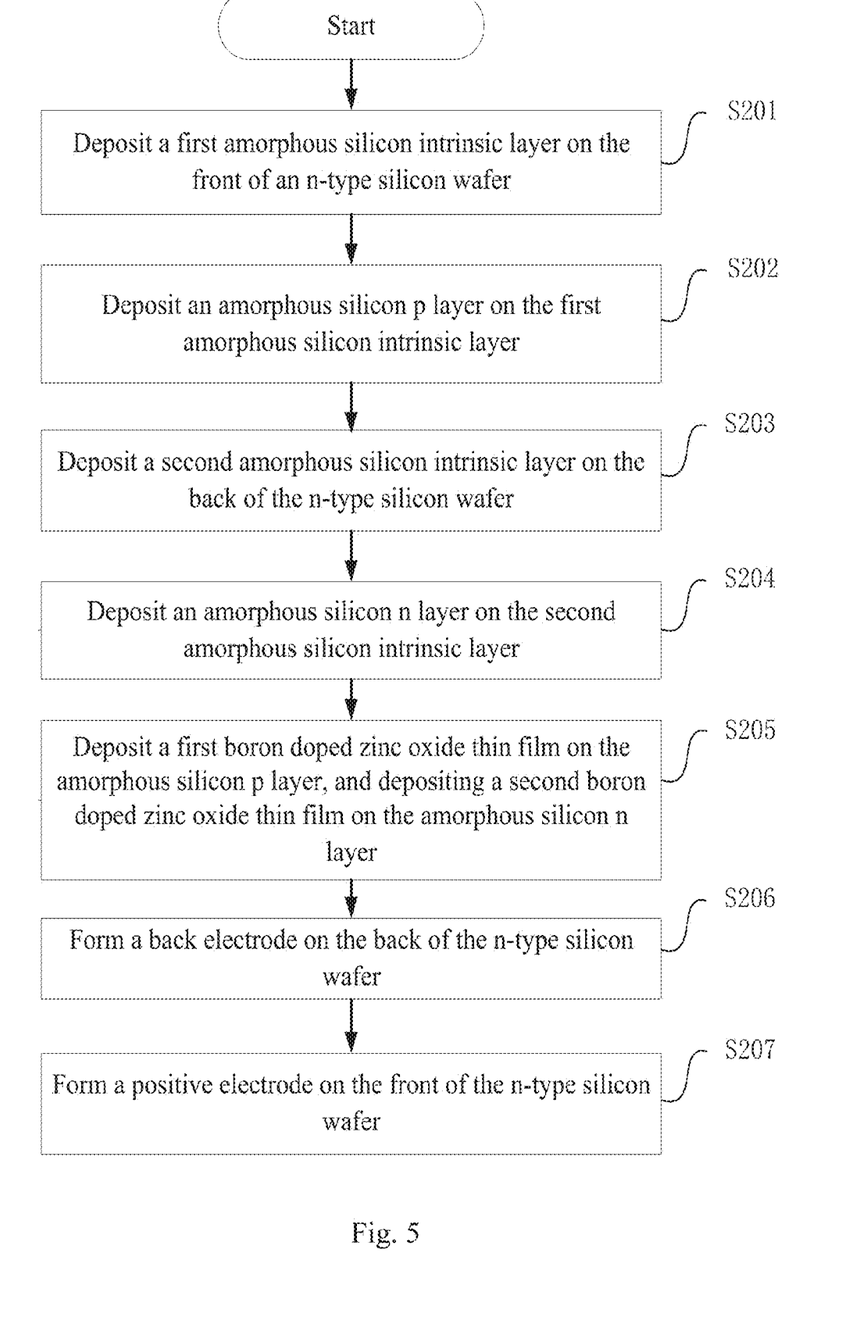
FIG. 5 is a schematic flowchart of a method of fabricating a double-sided heterojunction battery according to further one specific embodiment of the present invention.
Figure 6:
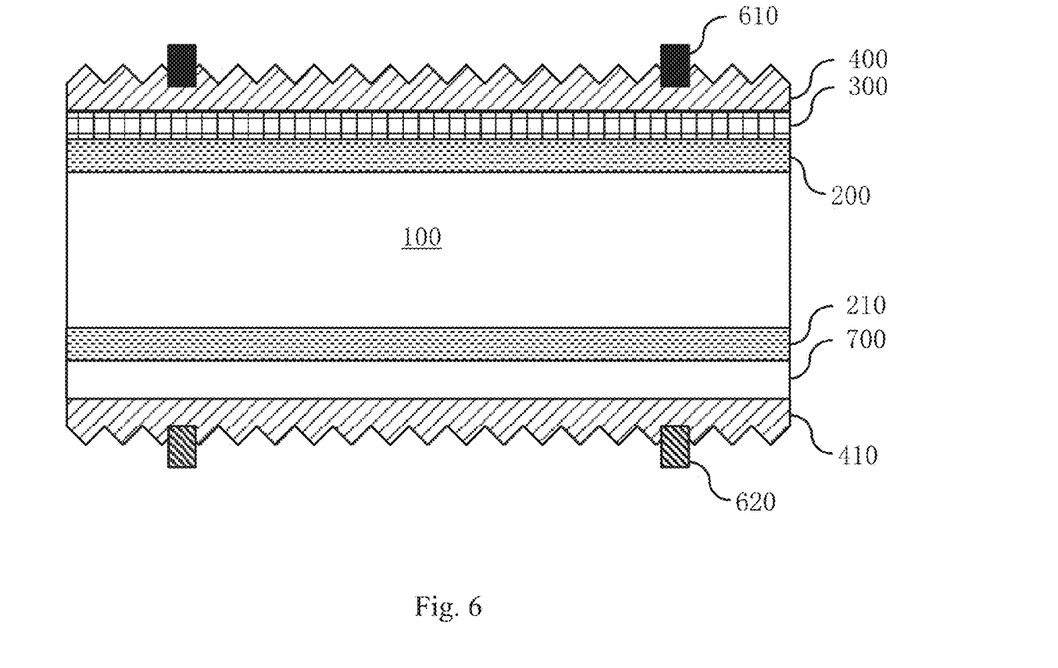
FIG. 6 is a schematic structural diagram of a method of fabricating a double-sided heterojunction battery according to further one specific embodiment of the present invention.

With reference to FIGS. 5 and 6, they are respectively a schematic flowchart of the method of fabricating a double-sided heterojunction battery in the present invention and the schematic structural diagram of the same.

In step S201, a first amorphous silicon intrinsic layer 200 is deposited on the front of an n-type silicon wafer 100. Before depositing amorphous silicon intrinsic layer 200, a surface of n-type silicon wafer 100 needs to be cleaned and cut-damaged, so as to fabricate a high-efficiency heterojunction battery on the smooth silicon wafer (damage removed).

Optionally, PECVD (Plasma Enhanced Chemical Vapor Deposition) method is adopted to deposit the amorphous silicon material to form first amorphous silicon intrinsic layer 200. Preferably, the range of the thickness of first amorphous silicon intrinsic layer 200 is between 5 nm and 30 nm, e.g. 5 nm, 18 nm or 30 nm.

In step S202, an amorphous silicon p layer 300 is deposited on first amorphous silicon intrinsic layer 200. Optionally, PECVD method is adopted to deposit the amorphous silicon material to form amorphous silicon p layer 300. Preferably, the range of the thickness of amorphous silicon p layer 300 is between 5 nm and 30 nm, e.g. 5 nm, 18 nm or 30 nm.

In step S203, a second amorphous silicon intrinsic layer 210 is deposited on the back of n-type silicon wafer 100. Optionally, PECVD (Plasma Enhanced Chemical Vapor Deposition) method is adopted to deposit the amorphous silicon material to form second amorphous silicon intrinsic layer 210. Preferably, the range of the thickness of the second amorphous silicon intrinsic layer 210 is between 5 nm and 30 nm, e.g. 5 nm, 18 nm or 30 nm.

In step S204, an amorphous silicon n layer 700 is deposited on the back of second amorphous silicon intrinsic layer 210. Optionally, PECVD (Plasma Enhanced Chemical Vapor Deposition) method is adopted to deposit the amorphous silicon material to form amorphous silicon n layer 700. Preferably, the range of the thickness of amorphous silicon n layer 700 is between 5 nm and 30 nm, e.g. 5 nm, 18 nm or 30 nm.

In step S205, a first boron doped zinc oxide thin film 400 is deposited on amorphous silicon p layer 300, and a second boron doped zinc oxide thin film 410 is deposited on amorphous silicon n layer 700. Optionally, LPCVD (Low Pressure Chemical Vapor Deposition) method is adopted to deposit the boron doped zinc oxide thin films. Preferably, the range of the thickness of first boron doped zinc oxide thin film 400 is between 500 nm and 1000 nm. e.g. 500 nm, 750 nm or 1000 nm. Preferably, a thickness range of second boron doped zinc oxide thin film 410 is between 500 nm and 1000 nm, e.g. 500 nm, 750 nm or 1000 nm.

As is clear from FIG. 7, a surface of the boron doped zinc oxide thin film presents a pyramid structure; this structure has good light trapping effect and thus can completely replace texturization and relevant cleaning process in the traditional process. In addition, forming an antireflection film by depositing the boron doped zinc oxide thin films in place of sputtering ITO (Indium Tin Oxide) can greatly reduce the usage amount of expensive ITO and further save the production cost.

In addition, by depositing second boron doped Zinc oxide thin film 410 on amorphous silicon n layer 400, good electric conduction effect can be produced on the back of the silicon wafer, which can replace an Al-back surface field.

In step S206, a back electrode 620 is formed on the back of the n-type silicon wafer.

In step S207, a positive electrode 610 is formed on the front of the n-type silicon wafer. Optionally, back electrode 620 and/or positive electrode 610 may be fabricated by printing silver paste or electrocoppering. Optionally, back electrode 620 and/or positive electrode 610 may be formed using electroplating or silk-screen printing, etc.

By means of the method of the present invention, LPCVD method is adopted to fabricate a boron doped zinc oxide (LPCVD-BZO) as a TCO layer. Since BZO is a transparent conductive material with a textured structure and has excellent light-trapping effect, and thus can replace the step of texturization; moreover, compared with common ITO, BZO is characterized by being low-cost, easy to fabricate and suitable for large scale production. Therefore, heterojunction batteries fabricated using the method of the present invention have a simple, reliable and low-cost process and a high photoelectric conversion efficiency, and moreover, are suitable for mass production.

As detailed illustrations have been presented to the exemplary embodiments and their advantages, it should be understood that various changes, replacements and modifications may be made to these embodiments without departing from the spirit of the present invention and the protection scope defined by the appended claims. With respect to other examples, those of ordinary skill in the art should understand that the order of process steps may vary while maintaining the protection scope of the present invention.

What is claimed is:
1. A method of fabricating a heterojunction battery, comprising the steps of:
   a) depositing a first amorphous silicon intrinsic layer on the front of an n-type silicon wafer;
   b) depositing an amorphous silicon p layer on the first amorphous silicon intrinsic layer;
   c) depositing a first boron doped zinc oxide thin film on the amorphous silicon p layer, wherein the range of the thickness of the first boron doped zinc oxide is between 500 nm and 1000 nm;
   d) forming a back electrode and an Al-back surface field on the back of the n-type silicon wafer;

e) forming a positive electrode on the front of the n-type silicon wafer.

2. The method according to claim 1, wherein the range of the thickness of the first amorphous silicon intrinsic layer is between 5 nm and 30 nm.

3. The method according to claim 1, wherein the range of the thickness of the amorphous silicon p layer is between 5 nm and 30 nm.

4. A method of fabricating a double-sided heterojunction battery, comprising the steps of:
   a) depositing a first amorphous silicon intrinsic layer on the front of an n-type silicon wafer;
   b) depositing an amorphous silicon p layer on the first amorphous silicon intrinsic layer;
   c) depositing a second amorphous silicon intrinsic layer on the back of the n-type silicon wafer;
   d) depositing an amorphous silicon n layer on the second amorphous silicon intrinsic layer;
   e) depositing a first boron doped zinc oxide thin film on the amorphous silicon p layer, and depositing a second boron doped zinc oxide thin film on the amorphous silicon n layer;
   f) forming a back electrode on the back of the n-type silicon wafer;
   g) forming a positive electrode on the front of the n-type silicon wafer.

5. The method according to claim 4, wherein the range of the thickness of the first amorphous silicon intrinsic layer is between 5 nm and 30 nm.

6. The method according to claim 4, wherein the range of the thickness of the amorphous silicon p layer is between 5 nm and 30 nm.

7. The method according to claim 4, wherein the range of the thickness of the second amorphous silicon intrinsic layer is between 5 nm and 30 nm.

8. The method according to claim 4, wherein the range of the thickness of the amorphous silicon n layer is between 5 nm and 30 nm.

9. The method according to claim 4, wherein the range of the thickness of the boron doped zinc oxide is between 500 nm and 1000 nm.

10. The method according to claim 5, wherein the range of the thickness of the boron doped zinc oxide is between 500 nm and 1000 nm.

11. The method according to claim 6, wherein the range of the thickness of the boron doped zinc oxide is between 500 nm and 1000 nm.

12. The method according to claim 7, wherein the range of the thickness of the boron doped zinc oxide is between 500 nm and 1000 nm.

13. The method according to claim 8, wherein the range of the thickness of the boron doped zinc oxide is between 500 nm and 1000 nm.

* * * * *